United States Patent [19]

Klauss et al.

[11] Patent Number: 5,398,833
[45] Date of Patent: Mar. 21, 1995

[54] DEVICE FOR CONTACT BETWEEN A CASE BOTTOM AND COVER OF A CLOSED HOUSING

[75] Inventors: Helmut Klauss, Augsburg; Heinz Stickel, Gröbenzell, both of Germany

[73] Assignee: Siemens Nixdorf Informationssysteme Aktiengesellschaft, Paderborn, Germany

[21] Appl. No.: 117,184

[22] PCT Filed: Mar. 2, 1992

[86] PCT No.: PCT/DE92/00169

§ 371 Date: Sep. 13, 1993

§ 102(e) Date: Sep. 13, 1993

[87] PCT Pub. No.: WO92/17046

PCT Pub. Date: Oct. 1, 1992

[30] Foreign Application Priority Data

Mar. 13, 1991 [DE] Germany .................. 9103040 U

[51] Int. Cl.⁶ .................................................. B65D 6/00

[52] U.S. Cl. .......................... 220/4.02; 220/4.21; 220/4.28

[58] Field of Search ............... 220/4.21, 4.02, 4.26, 220/4.28, 4.33, 615, 617, 621, 682

[56] References Cited

U.S. PATENT DOCUMENTS

| | | | |
|---|---|---|---|
| 2,731,555 | 1/1956 | Beck | 220/4.02 |
| 4,899,900 | 2/1990 | Debus et al. | 220/4.02 |
| 4,953,734 | 9/1990 | Stohr | 220/4.02 |
| 5,111,362 | 5/1992 | Flamm et al. | 220/4.02 |
| 5,207,342 | 5/1993 | Tsuji et al. | 220/4.28 |
| 5,280,132 | 1/1994 | Clarey et al. | 220/4.02 |

*Primary Examiner*—Joseph Man-Fu Moy
*Attorney, Agent, or Firm*—Hill, Steadman & Simpson

[57] ABSTRACT

Rails (6) are mounted on the insides of the side walls of a cuboid housing parallel to the top side of the housing. After the cover (1) has been mounted on the case bottom (2) of the housing, the rail (6) embraces with its U-shaped profile a seating support (7) which is opposite it and is joined to the case bottom (2). A plurality of sheet-metal strip springs (3) are introduced captively between the rail (6) and seating support (7).

8 Claims, 1 Drawing Sheet

DEVICE FOR CONTACT BETWEEN A CASE BOTTOM AND COVER OF A CLOSED HOUSING

BACKGROUND OF THE INVENTION

1. Field of the Invention

The invention relates to a device for contact between the case bottom and cover of a closed housing in which the cover can be pushed and/or slipped over the case bottom.

2. Description of the Related Art

In electronic equipment, in particular as used in telecommunications engineering and data engineering, the housing for the equipment is to be configured with respect to effective screening (EMC) and radio interference suppression in such a way that the influence of external interference remains as slight as possible. In the case of multipart housings which are assembled integrally, the boundaries between units therefore requires special measures, such as overlaps, labyrinths, spring contacts or complicated screwed joints.

Two-part housings consisting of a case bottom and cover therefore offer substantial advantages. In this case, the case bottom serves as a chassis in which the equipment components are installed. The cover is slipped and/or pushed over the case bottom. The interior of the case is therefore adequately shielded from interfering radiation without interruption. However, this applies only if a reliable electrical contact can be established between the case bottom and cover. This is particularly difficult, however, because possible contact regions are no longer accessible or are accessible only with difficulty when the housing is closed.

SUMMARY OF THE INVENTION

It is the object of an present invention to provide a contacting device for contacting the case bottom and cover of a closed housing, in which the cover can be pushed and/or slipped over the case bottom in such a way that a simple and yet reliable contact between the case bottom and cover is possible even at points that are difficult to access.

This and other objects is achieved according to the invention by both the case bottom and the cover each have the form of a cuboid that is open at least towards one side and are each produced in one piece from sheet metal, there are arranged on the insides of two mutually opposite side walls of the cover rails whose U-shaped profile contains a spring receiving surface approximately at right angles to the side wall, a supporting surface joined to the wall is opposite this spring receiving surface, which supporting surface is embraced by the open limbs of the rails, and contact springs are captively arranged between the spring receiving surface and supporting surface.

Advantageous developments and embodiments of the invention are provided when the spring receiving surface is parallel to the surface of the outside of the cover. Further, there are provided on the edges of the case bottom against which the cover bears when the housing is closed lug-like projections which are aligned such that they are parallel to the surface of the cover bearing against them. In one embodiment, strip contact springs are arranged between the surfaces, directed towards the cover, of the lug-like projections and the cover.

A preferred arrangement provides that the lug-like projections and the supporting surfaces of the case bottom are formed by bending the sheet metal.

BRIEF DESCRIPTION OF THE DRAWINGS

An exemplary embodiment of the invention is explained in more detail below with the aid of the drawings, wherein.

DETAILED DESCRIPTION OF THE PREFERRED EMBODIMENTS

Figure 1:
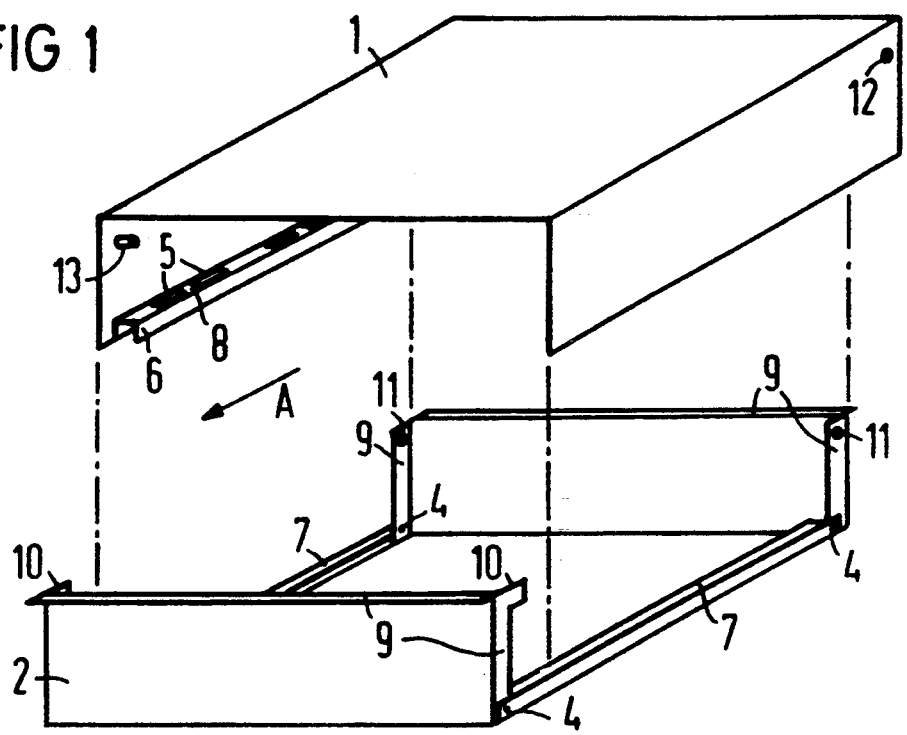
FIG. 1 shows a housing consisting of a case bottom and cover with a plurality of contacting devices, in a perspective, exploded representation.

FIG. 1 shows the perspective exploded representation of a closed cuboid housing. The housing, which is viewed from the rear, comprises a case bottom 2 and a cover 1. Both the case bottom 2 and cover 1 are each produced in one piece from a metal sheet. The case bottom 2 comprises an underside, a front side and a rear side of the cuboid housing. Lug-like projections 9, which are aligned such that they are parallel to the surface of the cover 1 which bears against them, may be seen at the edges of the front side and rear side of the case bottom 2, against which the cover 1 bears when the housing is closed. The lug-like projections 9 are thus either parallel to the top side of the cube or parallel to the side walls of the cube, and are formed by bending over the edge regions of the front side and rear side. The lateral edge regions of the underside of the cube are likewise bent over. By bending over these edge regions twice, two L-shaped seating supports are produced. The actual supporting surfaces (7) of the seating supports extend parallel to the underside, and project slightly into the interior of the case bottom 2. The region of the seating supports that is parallel to the side walls overlaps at its ends with the lug-like projections 9. This produces overlap points 4 at which a connection of the mutually overlapping sheet-metal parts is undertaken in order to reinforce the case bottom 2. If this connection is accomplished at the overlap points 4 by means of Toxes also referred to as arched shaped members, a connection which can absorb high transverse forces and, in addition, ensures high conductivity is achieved in a single operation.

The cover 1 can be slipped and pushed onto the case bottom 2. The cover 1 comprises the top side and the two side walls of the cuboid housing. For reasons of the rigidity of the cover 1, the cover 1 can additionally further comprise the front side of the cuboid housing. A rail 6 is arranged in each case on the insides of the free edge regions, opposite the top side, of the side walls. These rails 6 are formed by bending the edge regions mentioned. The profile of the rails 6 is in the shape of a U, the open limbs of the rails 6 pointing in the direction of the underside of the cuboid housing. The floor of the U-shaped profile of the rail 6 serves as a spring receiving surface. This spring receiving surface is at right angles to the side wall, and thus parallel to the top side of the housing. Cutouts 5 are introduced sequentially into the spring receiving surface in the direction of the longitudinal extent of the rail. By contrast with the neighbouring cutouts 5, in each case two of the cutouts 5, which are in the shape of a long hole, are located closely together and separated from one another by a web 8.

Figure 2:
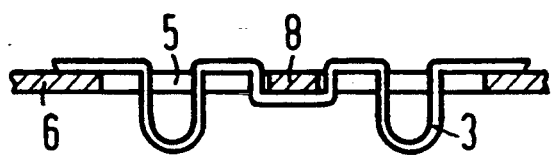
FIG. 2 shows a sectional representation through the spring receiving surface of a rail with a sheet-metal strip spring clamped in place, and, FIG. 3 shows a transverse section through the rail with the cover placed on the case bottom.

FIG. 2 shows a section along the rail 6 in the region of two closely adjacent cutouts 5. Clamped in these cutouts 5 is a sheet-metal strip contact spring which has three bows. All three bows point in the direction of the underside of the housing. The central bow embraces the web 8 in a self-closed fashion from the underside. The bows, which are arranged symmetrically with reference to a mid-line through the middle bow, are situated approximately in the middle of the respective cutout 5 in the shape of a long hole. The outer bows are larger than the middle bow and therefore project in the direction of the underside further from the spring receiving surface than does the middle bow. In order to be able to clamp the sheet-metal strip contact spring 3 captively in the cutouts, the sheet-metal strip contact spring 3 is so long that its ends that are plugged through the cutouts 5 rest on the surface of the spring receiving surface pointing towards the topside of the housing.

Figure 3:
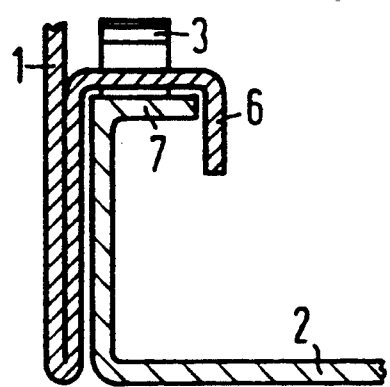

In order to mount or slip the cover 1 onto the case bottom 2, the cover 1 must project slightly over the front side of the case bottom 2. The rail 6 is therefore shortened, particularly in the region of the front side with respect to the length of the side walls. As may be seen from FIG. 3, the rail 6 embraces the supporting surface 7 when the cover 1 is mounted on the trough 2. The sheet-metal strip contact spring 3 is located between the supporting surface 7 and the spring receiving surface. It is seen that the ends of the sheet-metal strip contact spring 3 are forced away together with the outer bows are forced away in the direction of the top side of the housing. Since the spring force counteracts this forcing-away, a reliable contact is ensured between the cover 1 and case bottom 2.

After the cover 1 has been mounted on the case bottom 2, the cover 1 projects at the front side over the case bottom 2. In this position, the cover can be removed from the case bottom 2 again by simple lifting. This simple lifting of the cover 1 is prevented by displacing the cover 1 in the direction of the rear wall (in the direction indicated by arrow A). When the cover 1 is pushed back, bolts 13 projecting at right angles in the direction of the interior at the side walls are pushed under lugs 10. These lugs 10 are extensions of the lug-like projections 9 which are formed by bending over the lateral edge regions of the rear side. Additional bolts, for example, prevent removal of the cover in the front region. These bolts are inserted through bores 12 in the cover 1 and screwed into setting nuts. These setting nuts are located in bores 11 which are introduced into the lug-type projections 9, which project from the front side of the case bottom 2 parallel to the side walls in the direction of the rear side.

If increased demands are placed on the tightness of the housing with respect to shielding from interfering radiation, it is possible for commercially available sheet-metal strip contact springs to be bonded, riveted, screwed or plugged onto all the lug-like projections 9. The lamellae, of the sheet-metal strip contact springs which are prestressed in an undulating fashion, then spread between the lug-like projections 9 and the surfaces of the cover 1 that are opposite these projections 9.

Although other modifications and changes may be suggested by those skilled in the art, it is the intention of the inventors to embody within the patent warranted hereon all changes and modifications as reasonably and properly come within the scope of their contribution to the art.

We claim:

1. A device for contact between a case bottom and cover of a closed housing, in which the cover can be pushed and/or slipped over the case bottom, comprising:
   both the case bottom and the cover each are of a cuboid form that is open at least towards one side and are each produced in one piece from metal sheet,
   rails arranged on insides of two mutually opposite side walls of the cover, said rails being of a U-shaped profile and defining a spring receiving surface approximately at right angles to the side walls of the cover,
   a supporting surface joined to a side wall of the case bottom that is opposite said spring receiving surface, said supporting surface being embraced by legs of said U-shaped rails, and
   contact springs are captively arranged between said spring receiving surface and said supporting surface.

2. A device as claimed in claim 1, wherein said spring receiving surface is parallel to surface of an outside of the cover.

3. A device as claimed in claim 1, further comprising:
   lug-like projections on edges of the case bottom against which the cover bears when the housing is closed, said lug-like projections being aligned such that they are parallel to a surface of the cover bearing against them.

4. A device as claimed in claim 3, further comprising:
   strip contact springs arranged between surfaces of said lug-like projections which are directed toward the cover and the cover.

5. A device as claimed in claim 3, wherein said lug-like projections and said supporting surfaces of the case bottom are formed by bending the sheet metal of the case bottom.

6. A device as claimed in claim 1, wherein said rails are formed by bending edge regions of the side walls of the cover.

7. A device as claimed in claim 5, wherein said supporting surfaces and said lug-like projections overlap one another and are joined to one another at overlap points.

8. A device as claimed in claim 7, wherein said overlap points are joined to one another by arches.

* * * * *